US008829457B2

(12) United States Patent
Smith et al.

(10) Patent No.: US 8,829,457 B2
(45) Date of Patent: Sep. 9, 2014

(54) ULTRAVIOLET RADIATION DETECTOR AND DOSIMETER

(75) Inventors: Craig F. Smith, Incline Village, NV (US); Vladimir Ryzhikov, Kharkov (UA); Sergei Naydenov, Kharkov (UA); Dennis Wood, Los Altos, CA (US); Volodymyr Perevertailo, Kiev (UA)

(73) Assignees: Lawrence Livermore National Security, LLC., Livermore, CA (US); Vladimir Ryzhiko, Kharkov (UA); Dennis Wood, Los Altos, CA (US); Sergei Naydenov, Kharkov (UA); Volodymyr Perevertailo, Kiev (UA)

( * ) Notice: Subject to any disclaimer, the term of this patent is extended or adjusted under 35 U.S.C. 154(b) by 187 days.

(21) Appl. No.: 13/418,178

(22) Filed: Mar. 12, 2012

(65) Prior Publication Data
US 2012/0241633 A1    Sep. 27, 2012

Related U.S. Application Data

(60) Provisional application No. 61/466,091, filed on Mar. 22, 2011.

(51) Int. Cl.
*G01J 1/42* (2006.01)
*H01L 31/0216* (2014.01)
*H01L 31/108* (2006.01)

(52) U.S. Cl.
CPC ........ *H01L 31/108* (2013.01); *H01L 31/02162* (2013.01); *G01J 1/429* (2013.01)
USPC ....................................................... 250/372

(58) Field of Classification Search
USPC ........................................................ 250/372
See application file for complete search history.

(56) References Cited

U.S. PATENT DOCUMENTS

| 3,787,687 | A |   | 1/1974  | Trumble et al. |
| 4,212,535 | A |   | 7/1980  | Sanders et al. |
| 5,008,548 | A | * | 4/1991  | Gat ............................... 250/372 |
| 5,696,381 | A | * | 12/1997 | Quintern ................... 250/472.1 |
| 5,731,589 | A |   | 3/1998  | Sief et al. |
| 6,144,036 | A |   | 11/2000 | Danilychev |

OTHER PUBLICATIONS

Heydenreich, "Miniature Personal Electronic UVR Dosimeter with Erythema Response and Time-Stamped Readings in a Wristwatch," Photochemistry and Photobiology, 2005, 81: 1138-1144, 7 pages.
Rosenfeld et al, "Small-sized UV radiomeer on the basis of Schottky diodes," Radiaton Measurements, 46 (2011) 1666-1670, 5 pages.
Ryzhikov et al., Professional and household dosimeters for UV biologically active ranges of solar radiation on the basis of ZnSe 'semiconductor-metal' nanostructures, Proc. of SPIE vol. 7715, 77151 Q (2010), 11 pages.
Naval, Jr. et al, "Characterization of Zinc Selenide-Based Ultraviolet Detectors," Master's thesis from Naval Postgraduate School, Monterrey, CA (2009); approved for public release, 56 pages.
Naval, Jr. et al, "Zinc Selenide-Based Schottky Barrier Detectors for Ultraviolet-A and Ultraviolet-B Detection," Advances in OptoElectronics, vol. 201, Article ID 619571, 5 pages.

* cited by examiner

*Primary Examiner* — David Porta
*Assistant Examiner* — Hugh H Maupin
(74) *Attorney, Agent, or Firm* — Eddie E. Scott

(57) ABSTRACT

An ultraviolet radiation dosimeter apparatus for measuring an individual's ultraviolet radiation exposure from incoming ultraviolet rays, including an ultraviolet radiation dosimeter body; an ultraviolet filter in the ultraviolet radiation dosimeter body; a detector semiconductor substrate in the ultraviolet radiation dosimeter body connected to the ultraviolet filter for detecting the incoming ultraviolet rays and producing a signal, the semiconductor substrate made of ZnSe(Te), and a chip in the ultraviolet radiation dosimeter body for receiving the signal and measuring the individual's ultraviolet radiation exposure from the incoming ultraviolet rays.

2 Claims, 4 Drawing Sheets

ULTRAVIOLET RADIATION DETECTOR AND DOSIMETER

CROSS-REFERENCE TO RELATED APPLICATIONS

This application claims benefit under 35 U.S.C. §119(e) of U.S. Provisional Patent Application No. 61/466,091 filed Mar. 22, 2011 entitled "Dosimeter to Monitor Accumulated UV Dose for Long Time-scale Field Studies," the disclosure of which is hereby incorporated by reference in its entirety for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

1. Field of Endeavor

The present invention relates to ultraviolet radiation and more particularly to an ultraviolet radiation detector and dosimeter.

2. State of Technology

Intense, acute and recurrent ultraviolet radiation (UVR) exposure can be hazardous to men and women working or recreating in areas of high levels of solar UVR. Although thermal effects and resulting heat related injuries, direct damage to the exposed skin and the development of various skin cancers are among the most widely recognized of the harmful effects, other less well-understood effects of UVR exposure have also been identified. Studies indicate that UVR exposures at environmental levels suppress immune responses in both rodents and humans, resulting in enhanced susceptibility to infectious diseases including influenza and herpes. These impacts of UVR exposure represent potentially serious threats to the ability of workers to meet the demands of involving outdoor activities. In addition, non-work (recreational) activities frequently involve exposure to solar radiation.

To effectively assess the impacts of UVR exposure, an individual UV dosimeter capable of measuring and recording both UVA and UVB exposure over extended periods of time is an essential need. The use of a tried and proven UVA/B dosimeter capable of monitoring the levels of individual UVR can be an important tool in studies to evaluate direct impacts on individuals such as skin burning (erythema), carcinogenesis, and impacts to cellular immunity. New state-of-the-art advances in solid state UV detector technology have made it possible to construct a rugged, reliable, economical, and reusable device by which to measure UV exposure.

Some of the requirements for a personal ultraviolet dosimeter include the capability to measure and record UV dose rate and accumulated dose during entire deployment period for study individuals. The device must measure and record both UVA (320-400 nm) and UVB (280-320 nm) radiation with appropriate spectral sensitivity, operational flexibility and convenience.

In the past, considerable effort has been expended to develop a variety of different UV dosimeter technologies. Two paths have been considered; one, based on photosensitive film materials, and the other based on the response of photoelectric materials. In the case of photosensitive film-based sensors such as polisulphon film, the principle that is leveraged is that of photo-degradation of sensitive materials. Such detection systems have proven to have good sensitivity, but because of the operating principle, they have the disadvantages of not being reusable, being incapable of prolonged accumulation of data and exhibiting certain difficulties in providing quantitative measurements. For these reasons, detectors based on this principle are not considered suitable to meet emerging field study needs.

The second type of UV sensor, based on photoelectric response of materials, is more commonly used in modern digital instruments and is more suitable to long time-scale field studies. The photosensitive elements of most modern UV sensors are semiconductor photo-detectors—either photo-resistors or potential barrier structures. Photo-resistors have high photosensitivity, but they cannot operate in the electro-generator mode and have non-linear dependence of the photocurrent on radiation flux density. Therefore, the better approach to development of modern photo-detectors has been the creation of potential barrier structures, which: (i) have high impedance; (ii) can operate at high frequencies; and (iii) are compatible with microchip technologies. Especially attractive are Schottky diodes, because the short-wave UV radiation is absorbed in the region with a high electric field, and this substantially increases the response speed (up to $10^9$ s) and quantum efficiency (up to 70-80%).

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a detector and dosimeter that has the capability of measuring ultraviolet radiation. In one or more embodiments the present invention provides a detector and a dosimeter that have the capability of detecting and of recording ultraviolet radiation. In one or more embodiments the present invention provides a dosimeter that has the capability of measuring and recording ultraviolet radiation. In one or more embodiments the present invention provides an ultraviolet radiation dosimeter that has the capability of measuring and recording both UV-A (320-400 nm) and UV-8 (280-320 nm) radiation. In one or more embodiments the present invention provides an ultraviolet radiation dosimeter that has the capability of displaying UV dose rate and recording accumulated dose over a time period of up to one year.

In one embodiment the present invention provides an ultraviolet radiation dosimeter apparatus for measuring an individual's ultraviolet radiation exposure from incoming ultraviolet rays, including an ultraviolet radiation dosimeter body; an ultraviolet filter in the ultraviolet radiation dosimeter body; a detector semiconductor substrate in the ultraviolet radiation dosimeter body connected to the ultraviolet filter for detecting the incoming ultraviolet rays and producing a signal, the semiconductor substrate made of ZnSe(Te), and a chip in the ultraviolet radiation dosimeter body for receiving the signal and measuring the individual's ultraviolet radiation exposure from the incoming ultraviolet rays.

The present invention has use in medicine. The present invention has use in collecting exposure data for studies of individuals exposed to solar ultraviolet radiation. The present invention has use in collecting information for analysis of synthesis of vitamins D2 and D3. The present invention has use in monitoring of formation of "ozone holes" in the Earth atmosphere. The present invention has use in consumer monitoring of ultraviolet exposure. The present invention has use in ultraviolet exposure reduction. The present invention has use in studies of solar ultraviolet variability.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF SPECIFIC EMBODIMENTS

Figure 1:
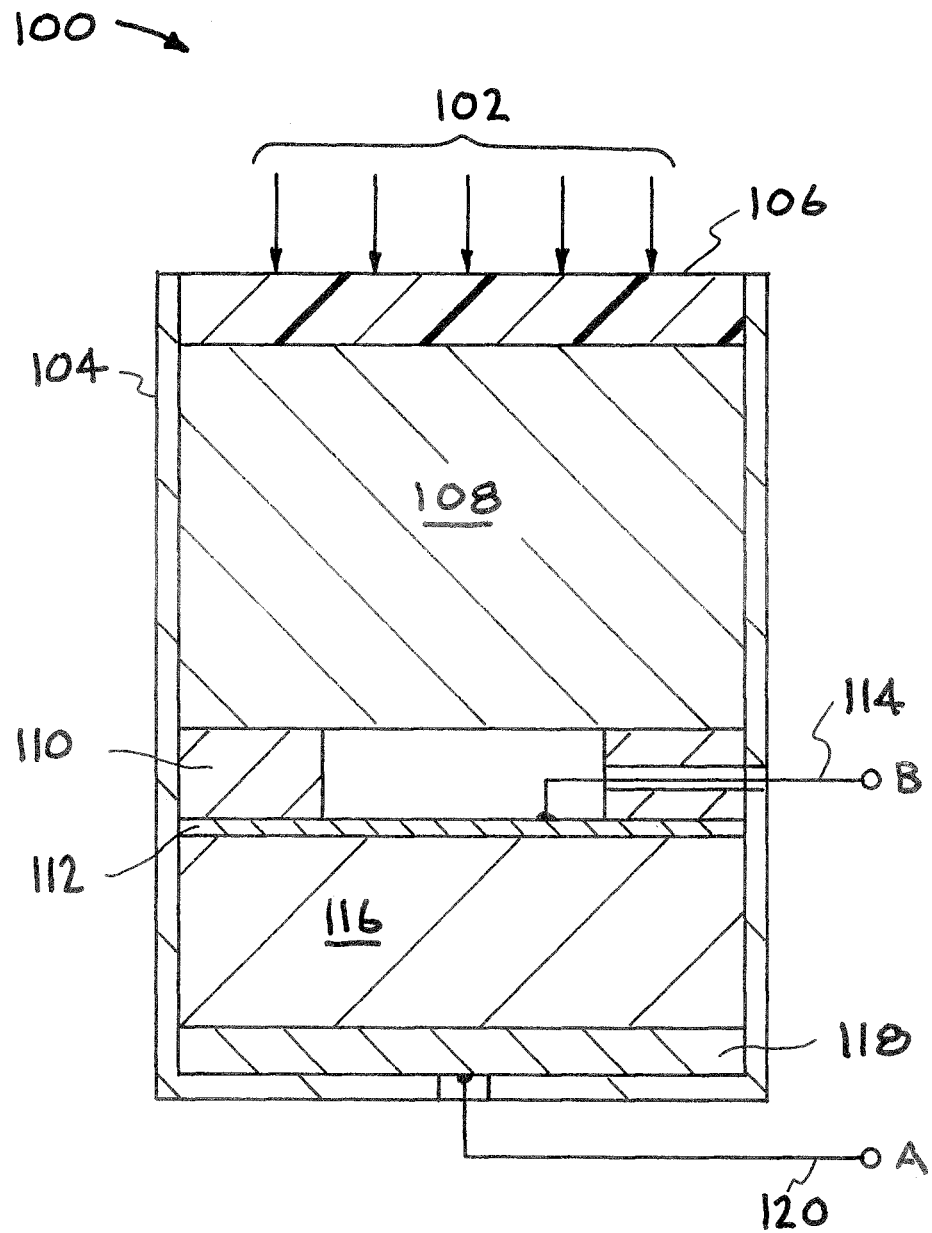
FIG. 1 illustrates one embodiment of a detector for an ultraviolet radiation dosimeter.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Referring now to the drawings, and in particular to FIG. 1, one embodiment of a detector for an ultraviolet radiation dosimeter constructed in accordance with the present invention is illustrated. This embodiment is a detector for an ultraviolet radiation dosimeter for measuring an individual's ultraviolet radiation exposure from incoming ultraviolet rays. This embodiment of a detector for an ultraviolet radiation dosimeter is designated generally by the reference numeral 100 and the incoming ultraviolet rays are designated generally by the reference numeral 102.

The detector 100 includes a detector body or outer case 104. A Teflon diffuser 106 in the detector body 104 receives and diffuses the incoming ultraviolet rays 102. An ultraviolet filter 108 in the detector body below the Teflon diffuser 106 receives and filters the incoming ultraviolet rays 102. A Textolite ring 110 is located in the detector body 104. A semi-transparent layer of metal (Ni) 112 is located in the detector body 104 beneath the Textolite ring 110. An electrical lead B 114 extends through the Textolite ring 110 and provides an electrical contact with the semi-transparent layer of metal (Ni) 112. A semiconductor substrate detector 116 is located in the detector body 104 beneath the semi-transparent layer of metal (Ni) 112 and receives the incoming ultraviolet rays 102 from ultraviolet filter 108. The detector semiconductor substrate 116 is positioned for detecting an individual's ultraviolet radiation exposure from the incoming ultraviolet rays that have passed through ultraviolet filter 108. A metal contact 118 is connected to the detector semiconductor substrate detector 116. An electrical lead A 120 is connected to the metal contact 118 provides an electrical contact with the semiconductor substrate detector 116.

As shown in FIG. 1, incoming ultraviolet rays 102 are received by UV filter 106. The filtered ultraviolet rays 102 are directed to the semiconductor substrate detector 116. The UV filter 106 is selected to pass the ultraviolet rays 102 to be detected and to block all other ultraviolet rays 102. The semiconductor substrate detector 116 receives the ultraviolet rays 102 to be detected and produces a signal. The signal from the semiconductor substrate detector 116 is transmitted through the semi-transparent layer of metal (Ni) 112 to electrical lead B 114 and is transmitted through the metal contact 118 to electrical lead A 120.

Figure 2:
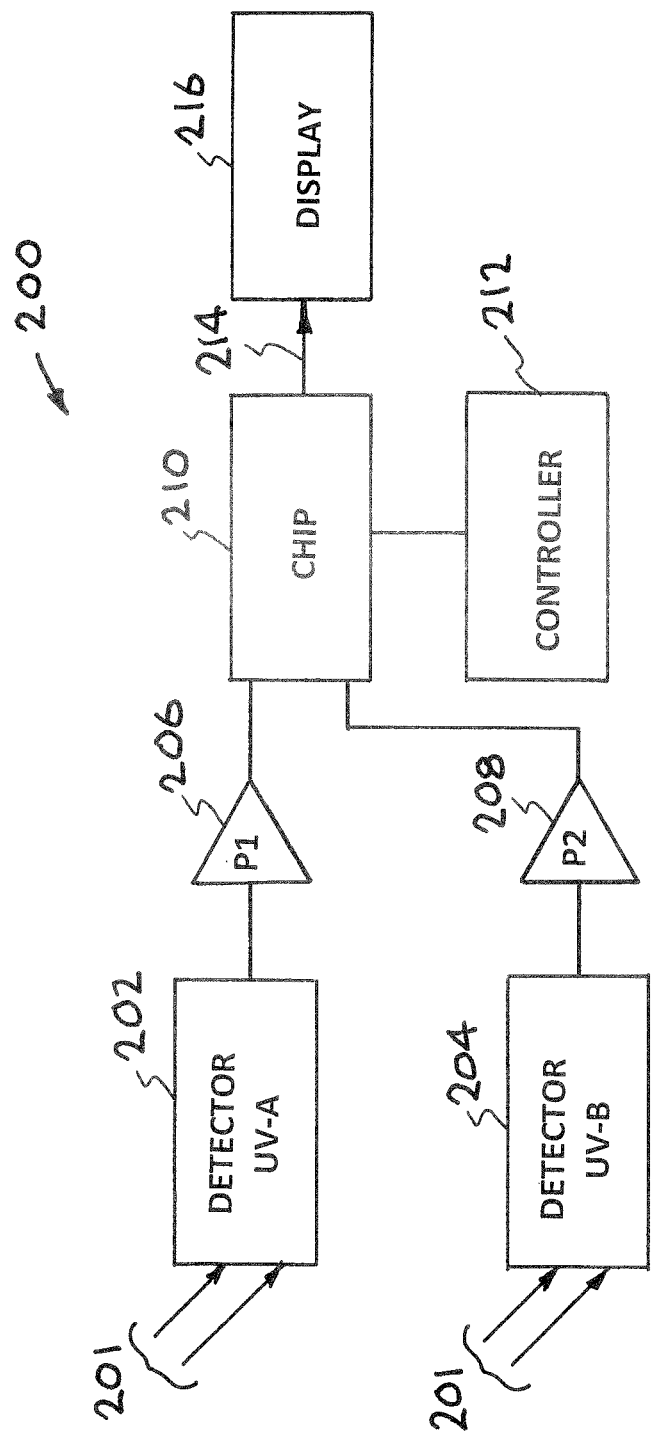
FIG. 2 illustrates an embodiment of an ultraviolet radiation dosimeter of the present invention.

Referring now to FIG. 2, one embodiment of an ultraviolet radiation dosimeter constructed in accordance with the present invention is illustrated. This embodiment of an ultraviolet radiation dosimeter is designated generally by the reference numeral 200. The ultraviolet radiation dosimeter 200 is capable of measuring and storing an individual's ultraviolet radiation exposure from incoming ultraviolet rays 201. The UV-radiometer 200 includes UV-A and UV-B detectors 202 and 204, a chip 210, and a display device 216. The diode detectors 202 and 204 receive the appropriate radiation through an internal filter and the diode detectors 202 and 204 produce signals which are sent to the chip 210. The chip 210 processes the signals and provides an output signal 214 which is sent to the display 216. The UV-radiometer system 200 includes the novel sensors 202 and 204 as well as the ancillary components (and software) needed to power the system 200, and to enable the collection of electronic outputs from the sensors 202 and 204, processing and storage of the data in chip 210 for present or future readout in display 216.

FIG. 2 is a block design of the UV-radiometer 200. Essentially, it is a two-channel device, with each channel tuned to a specified region of the UV spectral range: channel UV-A 315-400 nm (detector 202) and channel UV-B 275-315 nm (detector 202). The UV-sensors 202 and 204 are based on ZnSe Schottky photodiodes. The signal from the UV detectors 202 and 204 is transformed by a "current/voltage" converter made using transimpedance amplifiers 206 and 208. The amplified signals are directed to chip 210. The chip is controlled by controller 212 and the signals 214 from chip 210 can be displayed on display 218.

In one or more embodiments the present invention provides a dosimeter that has the capability of recording ultraviolet radiation. In one or more embodiments the present invention provides a dosimeter that has the capability of measuring and recording ultraviolet radiation. In one or more embodiments the present invention provides an ultraviolet radiation dosimeter that has the capability of measuring and recording both UV-A (320-400 nm) and UV-8 (280-320 nm) radiation. In one or more embodiments the present invention provides an ultraviolet radiation dosimeter that has the capability of displaying UV dose rate and recording accumulated dose over a time period of up to one year.

Additional details of the present invention are described in the article "Professional and household dosimeters for UV biologically active ranges of solar radiation on the basis of ZnSe semiconductor-metal nanostructures" by Volodymyr D. Ryzhikov, Gennadiy M. Onyshchenko, Craig F. Smith, Oleksandr D. Opolonin, Olena K. Lysetska, Leonid A. Piven', Igor M. Zenya, Olexiy V. Volkov, Evgeniy F. Voronkin, Sergey N. Galkin, Igor Bendeberia and Konstantin Katrunov in the journal Proc. SPIE 7715, 77151Q (2010), published Apr. 12, 2010 in Brussels, Belgium, Biophotonics: Photonic Solutions for Better Health Care II. The disclosure of the article "Professional and household dosimeters for UV biologically active ranges of solar radiation on the basis of ZnSe semiconductor-metal nanostructures" by Volodymyr D. Ryzhikov, Gennadiy M. Onyshchenko, Craig F. Smith, Oleksandr D. Opolonin, Olena K. Lysetska, Leonid A. Piven', Igor M. Zenya, Olexiy V. Volkov, Evgeniy F. Voronkin, Sergey N. Galkin, Igor Bendeberia and Konstantin Katrunov in the journal Proc. SPIE 7715, 77151Q (2010), published Apr. 12, 2010 in Brussels, Belgium, Biophotonics: Photonic Solutions for Better Health Care II is incorporated in this application in its entirety for all purposes.

EXAMPLES

Applicants have constructed and tested various ultraviolet radiation detector and dosimeter designs that incorporate the present invention. The designs produced devices that have the capability of displaying UV dose rate and recording accumulated dose over a time period of up to one year. This is accomplished through the integration of the sensor within a digital system that provides for recording, processing and storage of signals, as well for control of the instrument. This capability is provided by integration with the powerful single-chip M5P430-type computer produced by Texas Instruments. The microchip contains a built-in analog-to-digital converter, which allows substantial energy efficiency and long service time of the instrument without replacement of the power supply. The instrument is equipped with an energy-independent large capacity memory, which allows data recording, accumulation and storage for up to one year. The recorded data include radiant flux power (intensity), as well as accumulated dose for time intervals ranging from current daily value as well as long-term periods up to one year. The dosimeter will be capable of storing this data during the collection period and then downloading the data as needed.

Figure 3:
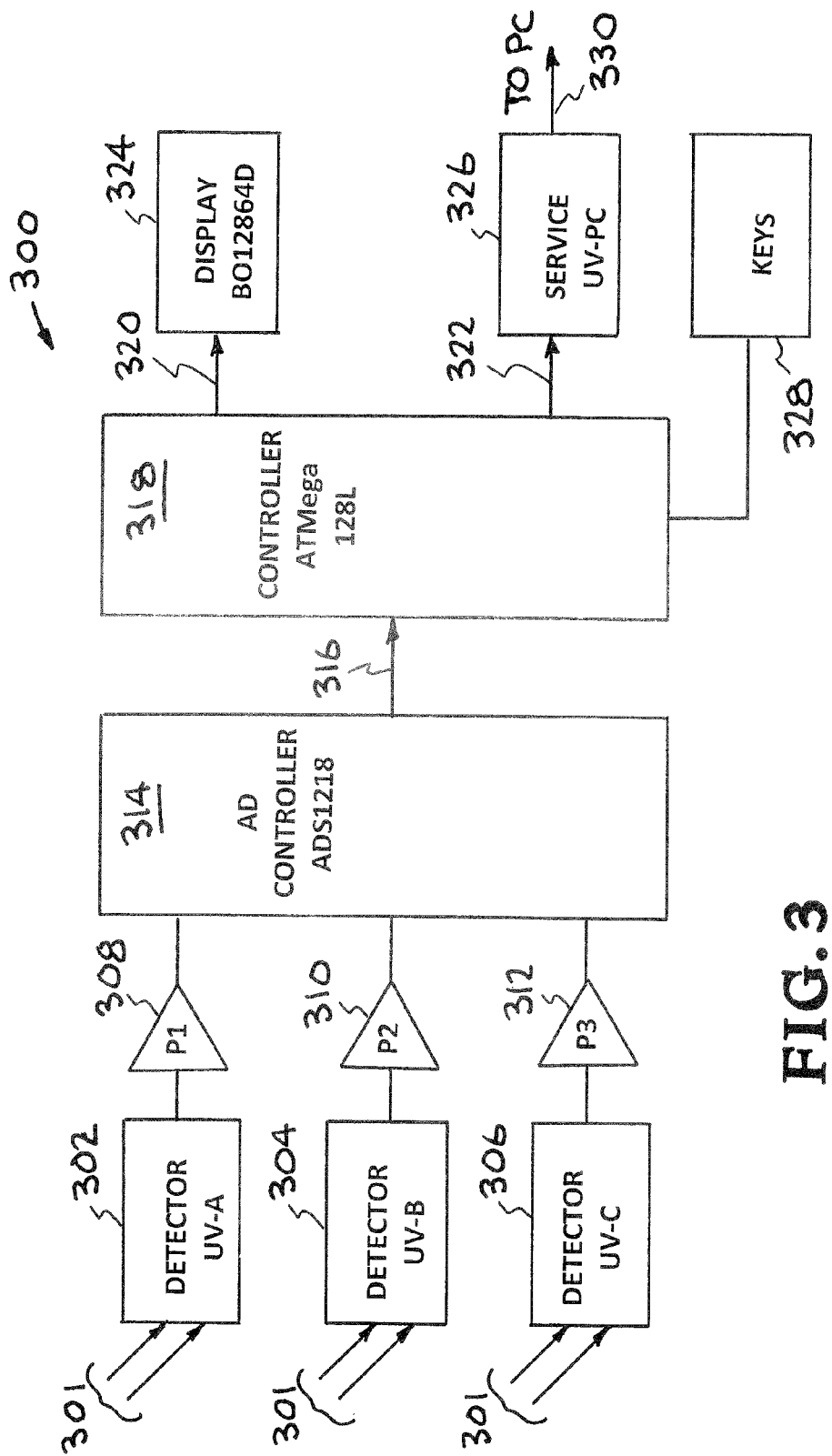
FIG. 3 illustrates one example of an ultraviolet radiation dosimeter constructed in accordance with the present invention.

Referring now to FIG. 3, an example of one of Applicants' ultraviolet radiation dosimeter designs constructed in accordance with the present invention is illustrated. This example of an ultraviolet radiation dosimeter is designated generally by the reference numeral 300. As illustrated by FIG. 3, the UV-radiometer 300 includes the following components: UV-A, UV-B, and UV-C detectors 302, 304, and 306; P1, P2, and P3 photocurrent to voltage amplifiers-converters 308, 310, and 312; AD converter—analog to digit converter 314; ATMega 128L—microcontroller 318; BO12864D—display device 324; Service UV-PC—service unit for controller programming by PC 326; and Keys—control keys 328.

FIG. 3 is a block design of the UV-radiometer 300. The ultraviolet radiation dosimeter 300 is capable of measuring and storing an individual's ultraviolet radiation exposure from incoming ultraviolet rays 301. Essentially, it is a three-channel device, with each channel tuned to a specified region of the UV spectral range: channel UV-A—315-400 nm (detector 302), channel UV-B—275-315 nm (detector 304) and channel UV-C—200-275 nm (detector 306). The useful signal from the UV detectors is transformed by a "currentevoltage" converter made using transimpedance amplifiers. The feedback resistance R is 75 MOhm, the working point of the photoconverter is in the 4th quadrant, corresponding to the photodiode voltage of $\sim+0.2\times10^{-3}$ V. The high frequency band of the preamplifier is limited at 3 Hz.

The UV-sensors 302, 304, and 306 are based on ZnSe Schottky photodiodes and have the following characteristics: the integral sensor sensitivity S is ~0.1 A/W, the dark current $I_d$ at $10\times10^{-3}$ V bias voltage is $\sim 2\times10^{-12}$ A, which corresponds to detection threshold of about $2\times10^{-11}$ W. Signals from the amplifiers 308, 310, and 312 are inputted into a 24-bit A/D convertor ADS1218 314, which allowed creation of a single-range recorder with a broad dynamic range of ~1:200 000. The signal 316 from A/D convertor ADS1218 314 is directed to microcontroller 318. A signal 320 from microcontroller 318 is directed to display 324. A signal 322 from microcontroller 318 is directed to service unit 326. The signal 330 from service unit 326 is directed to a PC.

Additional details of the present invention and in particular the ultraviolet radiation dosimeter 300 are described in the article "Small-sized UV radiometer on the basis of Schottky diodes" by A. B. Rosenfeld, V. D. Ryzhikov, G. M. Onyshchenko, S. M. Galkin, O. D. Opolonin, O. K. Lysetska, V. L. Perevertaylo, L. A. Piven, E. F. Voronkin, and I. M. Zenya in the journal Radiation Measurements 46 (2011) 1666-1670, published December 2011. The disclosure of the article "Small-sized UV radiometer on the basis of Schottky diodes" by A. B. Rosenfeld, V. D. Ryzhikov, G. M. Onyshchenko, S. M. Galkin, O. D. Opolonin, O. K. Lysetska, V. L. Perevertaylo, L. A. Piven, E. F. Voronkin, and I. M. Zenya in the journal Radiation Measurements 46 (2011) 1666-1670, published December 2011 is incorporated in this application in its entirety for all purposes.

Figure 4:
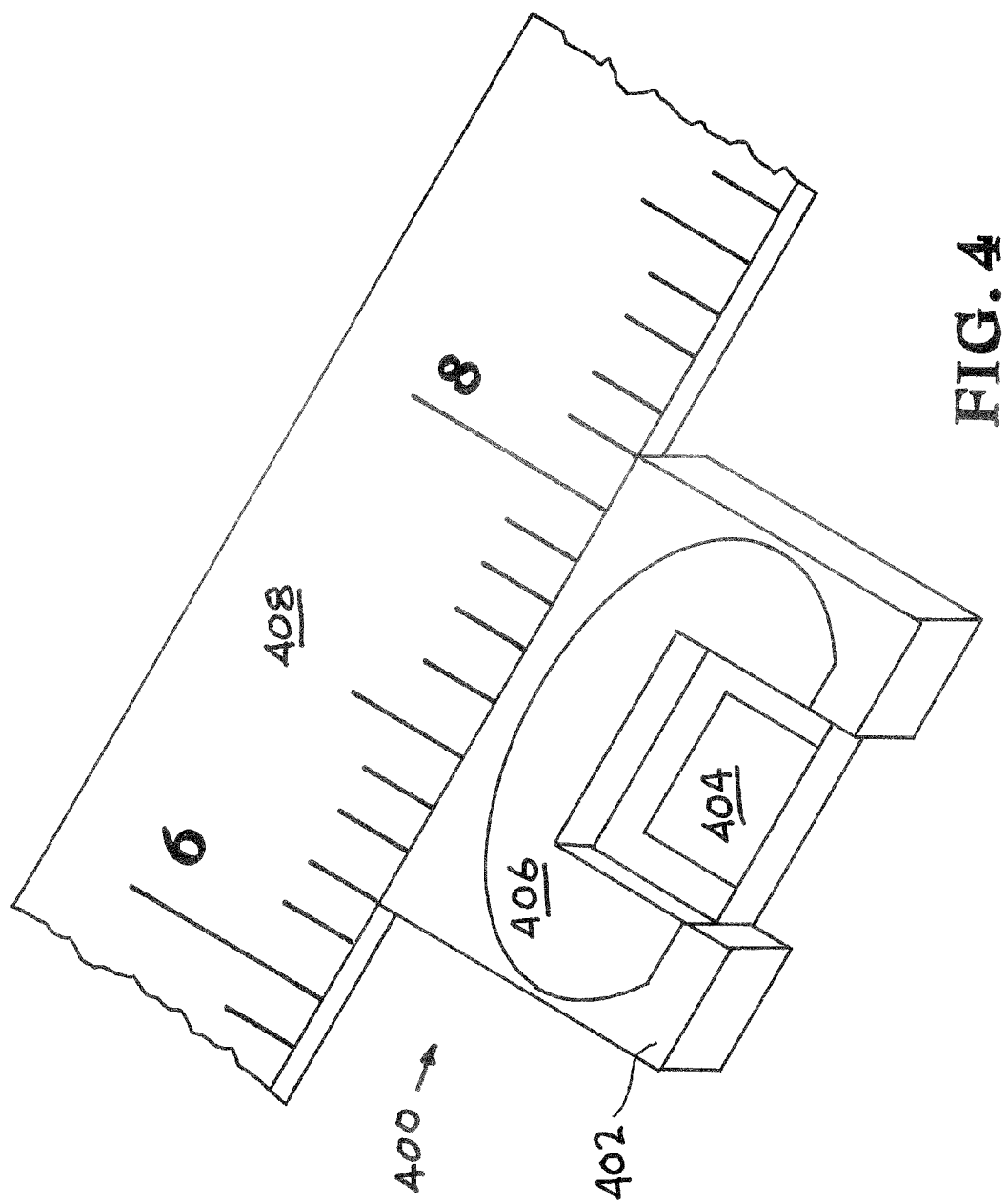
FIG. 4 illustrates another example of an ultraviolet radiation dosimeter constructed in accordance with the present invention.

Referring now to FIG. 4, one example of an ultraviolet radiation dosimeter constructed in accordance with the present invention is illustrated. This example of an ultraviolet radiation dosimeter is designated generally by the reference numeral 400.

The ultraviolet radiation dosimeter 400 is shown adjacent a ruler 408 to illustrate the small size of the ultraviolet radiation dosimeter. The small-sized ultraviolet radiation dosimeter 400 was designed by Applicants to be a compact and convenient wearable unit of comparable dimensions and appearance to that of a wristwatch providing easy deployability and use. The ultraviolet radiation dosimeter 400 dimensions are 190×60×30 mm.

The ultraviolet radiation dosimeter 400 includes a detector body 402, a detector semiconductor substrate 404, and a chip 406. In the detector semiconductor substrate 404 Applicants used a UV-sensor made of surfacebarrier Schottky structures on the basis of zinc selenide activated ZnSe(Te, X).

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. An ultraviolet radiation dosimeter for measuring and recording UV-A 315-400 nm radiation and UV-B 275-315 nm radiation from incoming ultraviolet rays, consisting of:

a dosimeter body, a diffuser in said dosimeter body for receiving and diffusing the incoming ultraviolet rays, an ultraviolet filter in said dosimeter body connected to said diffuser for filtering UV-A 315-400 nm radiation and UV-B 275-315 nm radiation from the incoming ultraviolet rays, a semiconductor detector made of ZnSe(Te) in said dosimeter body connected to said ultraviolet filter that receives the UV-A 315-400 nm radiation and UV-B 275-315 nm radiation from the incoming ultraviolet rays and produces signals, amplifiers for amplifying said signals, a chip that receives said signals for measuring and recording the UV-A 315-400 nm radiation and the UV-B 275-315 nm radiation from the incoming ultraviolet rays, a controller connected to said chip, and a display connected to said chip, wherein said chip is controlled by said controller and wherein said display displays said signals.

2. A method of measuring and recording an individual's UV-A 315-400 nm radiation and UV-B 275-315 nm ultraviolet radiation exposure from incoming UV-A 315-400 nm radiation and UV-B 275-315 nm radiation ultraviolet rays, consisting of the steps of:

filtering the ultraviolet UV-A 315-400 nm radiation and UV-B 275-315 nm radiation producing filtered ultraviolet UV-A 315-400 nm radiation and UV-B 275-315 nm radiation;

using a semiconductor detector made of ZnSe(Te) for detecting said filtered UV-A 315-400 nm radiation and UV-B 275-315 nm ultraviolet radiation and producing a signal, using a chip connected to said semiconductor detector that is controlled by a controller for receiving and recording said signal and measuring the individual's ultraviolet UV-A 315-400 nm radiation and UV-B 275-315 nm radiation exposure from the incoming UV-A 315-400 nm radiation and UV-B 275-315 nm radiation ultraviolet rays, and using a display connected to said chip for displaying said signal.

* * * * *